(12) United States Patent
Frosien

(10) Patent No.: US 8,866,102 B2
(45) Date of Patent: Oct. 21, 2014

(54) ELECTRON BEAM DEVICE WITH TILTING AND DISPERSION COMPENSATION, AND METHOD OF OPERATING SAME

(75) Inventor: Jürgen Frosien, Riemerling (DE)

(73) Assignee: ICT Integrated Circuit Testing Gesellschaft für Halbleiterprüftechnik mbH, Heimstetten (DE)

(*) Notice: Subject to any disclaimer, the term of this patent is extended or adjusted under 35 U.S.C. 154(b) by 250 days.

(21) Appl. No.: 13/177,957

(22) Filed: Jul. 7, 2011

(65) Prior Publication Data

US 2012/0006997 A1    Jan. 12, 2012

(30) Foreign Application Priority Data

Jul. 9, 2010 (EP) .................................... 10169109

(51) Int. Cl.
*H01J 1/50*     (2006.01)
*H01J 37/147*   (2006.01)
*H01J 37/153*   (2006.01)
*H01J 37/28*    (2006.01)

(52) U.S. Cl.
CPC ....... *H01J 37/153* (2013.01); *H01J 2237/1534* (2013.01); *H01J 2237/2611* (2013.01); *H01J 2237/1523* (2013.01); *H01J 37/1471* (2013.01); *H01J 37/1478* (2013.01); *H01J 37/28* (2013.01)
USPC ................... 250/396 ML; 250/306; 250/307; 250/396 R

(58) Field of Classification Search
USPC ...... 250/306, 307, 310, 311, 396 R, 396 ML, 250/397, 398
See application file for complete search history.

(56) References Cited

U.S. PATENT DOCUMENTS

| | | |
|---|---|---|
| 2004/0227081 A1 | 11/2004 | Sato et al. |
| 2005/0253083 A1 | 11/2005 | Sato et al. |
| 2005/0285036 A1 | 12/2005 | Sato et al. |
| 2010/0320382 A1* | 12/2010 | Almogy et al. ............... 250/307 |

OTHER PUBLICATIONS

Extended European Search Report, dated Sep. 16, 2010, Application No. EP10169109.5.

* cited by examiner

*Primary Examiner* — Nicole Ippolito
*Assistant Examiner* — Hanway Chang
(74) *Attorney, Agent, or Firm* — Patterson & Sheridan, LLP

(57) ABSTRACT

An electron beam device 100 includes: a beam emitter 102 for emitting a primary electron beam 101; an objective electron lens 127 for focusing the primary electron beam 101 onto a specimen 130, the objective lens defining an optical axis 126; a beam tilting arrangement 103 configured to direct the primary electron beam 101 to the electron lens 127 at an adjustable offset from the optical axis 126 such that the objective electron lens 127 directs the electron beam 101 to strike the specimen 130 at an adjustable oblique beam landing angle, whereby a chromatic aberration is caused; a beam separator 115 having a first dispersion for separating a signal electron beam 135 from the primary electron beam 101; and a dispersion compensation element 104 adapted to adjust a compensation dispersion of the primary electron beam 101 so as to compensate for a beam aberration resulting from the first dispersion and from the chromatic aberration.

21 Claims, 8 Drawing Sheets

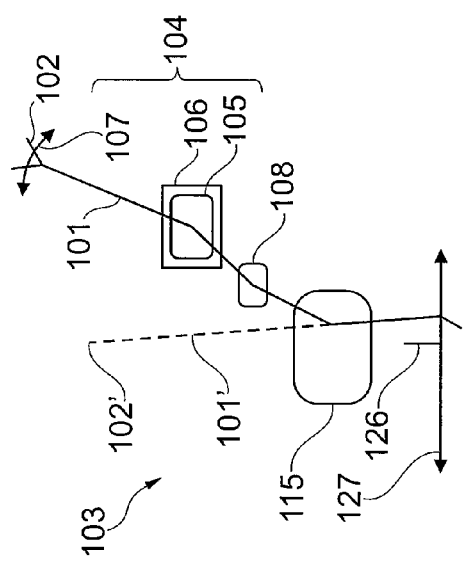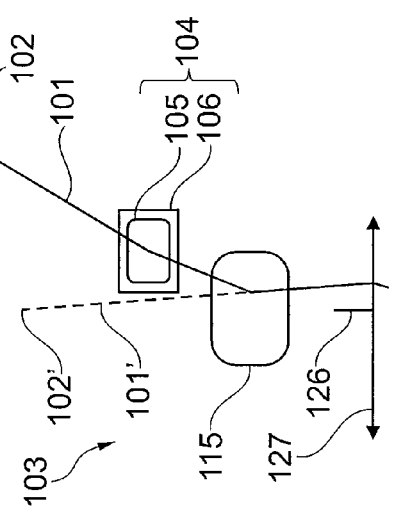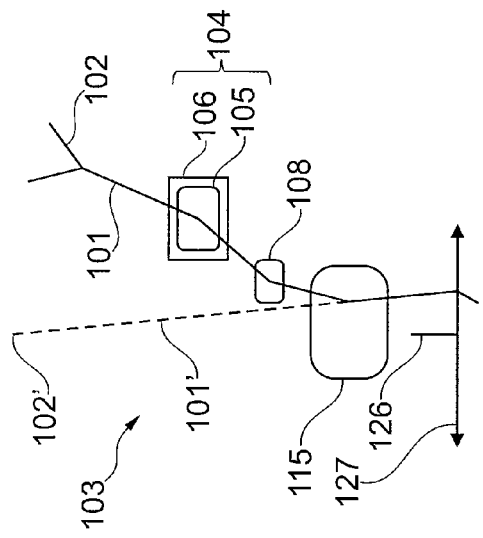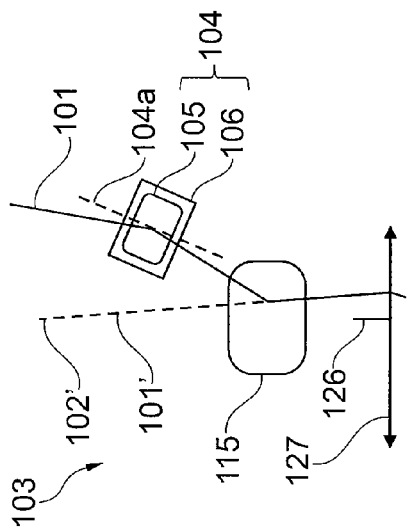

ELECTRON BEAM DEVICE WITH TILTING AND DISPERSION COMPENSATION, AND METHOD OF OPERATING SAME

FIELD OF THE INVENTION

Aspects of the invention relate to an electron beam device, e.g. for imaging or for manipulating a specimen, and a method of operating the same. More particularly, aspects of the invention relate to an electron beam device including a beam emitter; a beam tilting arrangement; an objective electron lens; and a beam separator for separating a signal electron beam from the primary electron beam.

BACKGROUND OF THE INVENTION

Charged particle beam devices have many functions in a variety of industrial fields, including, but not limited to, inspection of semiconductor devices during manufacturing, exposure systems for lithography, detection devices and testing systems. Thus, there is a high demand for structuring and inspecting specimens within the micrometer and nanometer scale.

In particular, the advancement of semiconductor technologies has created a high demand for structuring and probing specimens within the nanometer scale. Micrometer and nanometer scale process control, inspection or structuring is often performed with electron beams. Probing or structuring is often performed with electron beams which are generated and focused in electron beam devices. Examples of electron beam devices are electron microscopes, in particular scanning electron microscopes (SEM), or electron beam pattern generators. Electron beams offer superior spatial resolution compared to photon beams, due to their short wavelengths at comparable particle energy.

For semiconductor manufacturing, throughput can be a significant limitation in tools for scanning a given geometry in its entirety. Assuming a SEM resolution of 1 nm, a 10 mm$^2$ die contains 10E14 pixels. Accordingly, for covering the entire layout, a fast inspection architecture is desired. For achieving high throughput at a desired signal-to-noise ratio (SNR), it is desired to have an electron beam device with a high electron beam intensity.

However, at high electron beam intensity the interaction between electrons of the electron beam have an increasing effect on the beam. Due to the electron-electron interactions, the energy and spatial resolution of the beam is decreased. Therefore, measures to mitigate the electron-electron interactions of the beam have been devised, such as broadening the primary electron beam. However, there still exists a need to further reduce the effects of electron-electron interactions.

A further need is allowing the beam to be tilted so that it impinges on the specimen at an inclined angle. By tilting the beam, additional image information can be obtained, allowing e.g. for a three-dimensional-type imaging of the specimen. Ideally, images at various tilt angles can be combined with each other. This is possible by tilting the beam electronically. However, electronic tilting of the beam produces additional aberrations such as a chromatic aberration of the electron beam, thus reducing the image quality.

SUMMARY OF THE INVENTION

In light of the above, the present invention intends to provide an electron beam device, and a method of operating an electron beam device, by which the above-mentioned problems are at least partially reduced.

To this purpose, the charged particle device according to independent claim 1, and by the method according to independent claim 20 are provided. Further advantages, features, aspects and details of the invention are evident from the dependent claims, the description and the drawings.

According to one embodiment, an electron beam device includes: a beam emitter for emitting a primary electron beam; an objective electron lens for focusing the primary electron beam onto a specimen, wherein the objective lens defines an optical axis; and a beam tilting arrangement configured to direct the primary electron beam to the electron lens at an adjustable offset from the optical axis such that the objective electron lens directs the electron beam to hit the specimen at an adjustable oblique beam landing angle (the oblique beam landing angle is generally adjustable by adjustment of the offset, and the offset may be adjustable by tuning a parameter, such as voltage, current, etc, of the apparatus), whereby a chromatic aberration is caused. The beam tilting arrangement may include at least two deflectors, wherein the deflectors may be included in the beam separator and/or the dispersion compensation element (see below) and/or additional deflector(s). The beam tilting arrangement may further include a beam tilting controller programmed to cause the deflectors to deflect the beam such that the beam is directed as described above. The electron beam device further includes: a beam separator having a first dispersion for separating a signal electron beam from the primary electron beam; and a dispersion compensation element adapted for adjusting a compensation dispersion of the primary electron beam such as to compensate for a beam aberration resulting from the first dispersion and from the chromatic aberration. Herein, compensation means first-order (linear order) compensation. In practice, there may remain some aberration from higher-order effects, from imperfect adjustment, from spherical aberrations, etc. The dispersion compensation element may include a deflector contributing to the beam tilting, and thus also belonging to the beam tilting arrangement.

According to another embodiment, a method of operating an electron beam device includes: the emission of a primary electron beam by a beam emitter; the adjustment of a compensation dispersion of the primary electron beam by a compensation element; directing, by a beam tilting arrangement, the primary electron beam to an electron lens at an adjusted offset from an optical axis defined by the electron lens; allowing the primary electron beam to pass through a beam separator having a first dispersion; focusing the offset primary electron beam onto a specimen by the objective electron lens, thereby causing a chromatic aberration of the primary electron beam and directing the primary electron beam to hit the specimen at an adjusted oblique beam landing angle; the generation of a signal electron beam by an interaction of the primary electron beam with the specimen; and the separation of the signal electron beam from the primary electron beam by the beam separator. Thereby, the dispersion compensation element adjusts the compensation dispersion in such a way as to compensate for a beam aberration resulting from the first dispersion and from the chromatic aberration.

The embodiments are also directed to methods by which the described apparatus operates. The methods include method steps for carrying out all functions of the apparatus. Further, the embodiments are also directed to a beam apparatus having a controller adapted for carrying out any of the method steps or controlling functions described herein.

BRIEF DESCRIPTION OF THE DRAWINGS

Some of the above indicated and other more detailed aspects of the invention will be described in the following description and partially illustrated with reference to the figures. Therein:

FIGS. 4a to 4l show schematic side views of respective dispersion compensation elements of electron beam apparatuses according to further embodiments.

DETAILED DESCRIPTION OF THE DRAWINGS

In the following passages, different aspects of the invention are defined in more detail. Without limiting the scope of the present application, the electron beam apparatus might be adapted for inspection or lithography, such as a scanning electron microscope (SEM) or the like.

Figure 5:
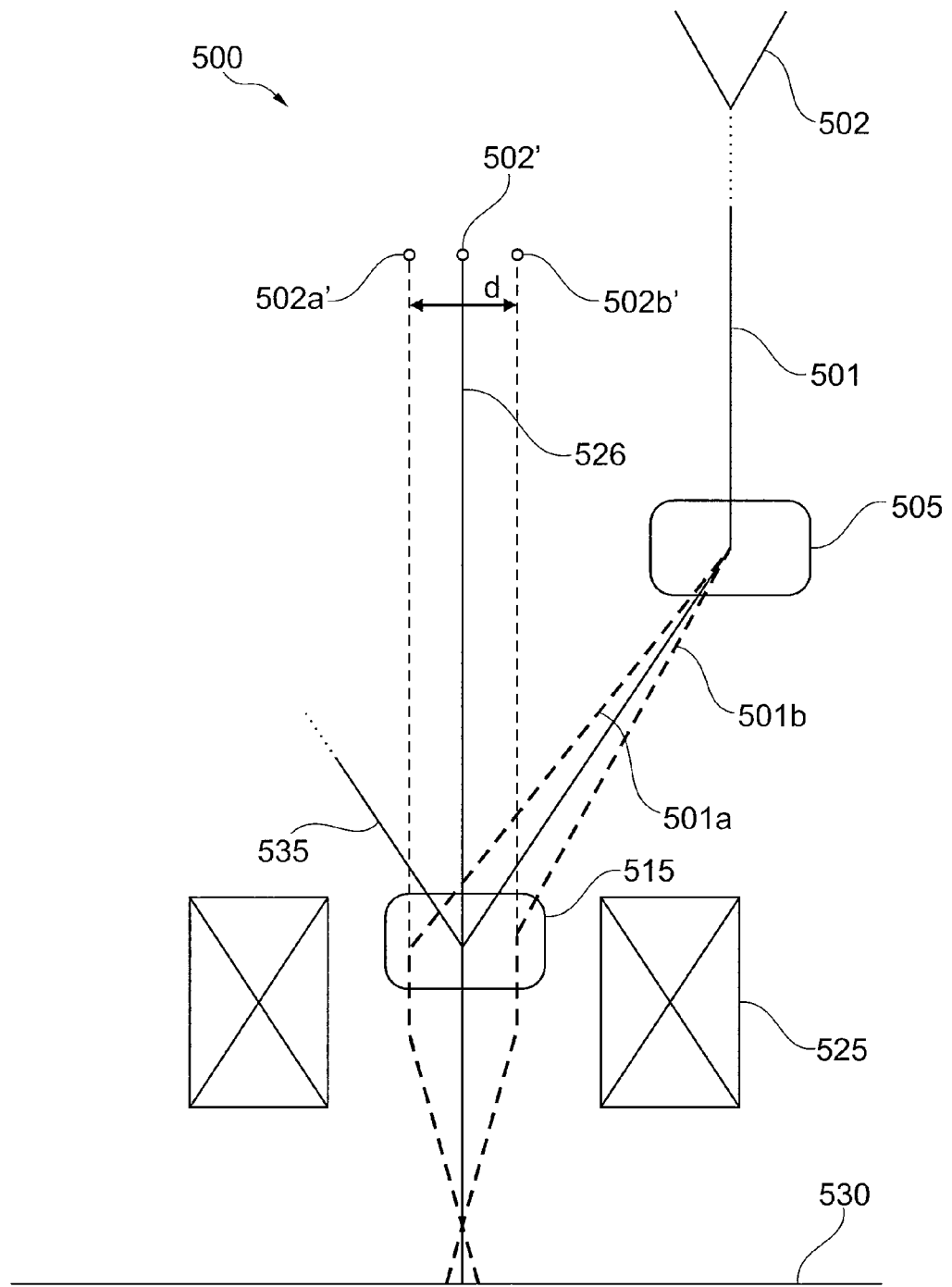
FIG. 5 shows a schematic side view of an electron beam apparatus according to an illustrative example.

So that the advantages of the embodiments can be better appreciated, an illustrative example will first be described with reference to FIG. 5. FIG. 5 shows an optical system 500 similar to the system described in the published patent application US 2006/0151711. In the optical system 500, a primary electron beam 501 from an emitter (not shown) is deflected as it passes through a magnetic beam deflection coil 505, and is again deflected as it passes through a further magnetic beam deflection coil 515. The primary electron beam 501 is then focused onto a sample 530 by an objective lens 525 (e.g. an electrostatic and/or magnetic focusing lens) defining an optical axis 526. A signal electron beam 535, resulting from an interaction of the primary beam 501 with the sample 530, then travels in the opposite direction. The signal electron beam 535 is deflected as it passes through the further magnetic-beam separator deflection coil 515 and is thereby separated from the primary beam 501. The signal beam 535 is then guided to a detector (not shown).

In the system of FIG. 5, the deflection of the primary beam 501 due to coil 505 is equal in magnitude and opposite in sign as compared to its deflection due to coil 515. The purpose of this arrangement is to allow a column which is vertically aligned, and hence allow vertically aligned optical elements in the regions upstream the deflection coil 505 and downstream of the deflector 515, despite the fact that the deflection coil 515 deflects the beam. The double deflection has the further effect of displacing the beam 501 as shown in FIG. 5. Thus, when entering the objective lens 525, the beam 501 appears to emerge from a virtual source 502' that is displaced with respect to the real source 502. The objective lens 525 is arranged such that the virtual source 502' lies on the optical axis 526 defined by the objective lens 525.

However, by the arrangement of FIG. 5, the image is blurred due to dispersion: In FIG. 5, in addition to the primary beam 501 as represented by the main energy beam portion of the beam 501, a beam portion 501a with lower energy than the mean energy and a beam portion 501b with higher energy than the mean energy are shown. Also, for the beam portions 501a and 501b, the deflection due to coil 505 is equal in magnitude and opposite in sign as compared to the deflection due to coil 515. However, the lower-energy beam portion 501a is deflected by both coils 505, 515 to a larger extent, and is therefore ultimately displaced more than the main-energy beam portion 501. Hence, the virtual source 502a' of the lower-energy beam portion 501a is displaced with respect to the virtual source 502' of the main beam portion. Similarly, the higher-energy beam portion 501b is deflected by both coils 505, 515 to a lesser extent, and is therefore ultimately displaced less than the main-energy beam portion 501. Hence, the virtual source 502b' of the higher-energy beam portion 501b is displaced with respect to the virtual source 502' of the main beam portion. As a result, a beam containing the beam portions 501a and 501b appears to originate from a line-like virtual source of width d instead of a point-like virtual source, and the beam which strikes the specimen is correspondingly widened in the deflection direction (i.e. the direction orthogonal to the optical axis 526 in the drawing plane of FIG. 5). This widening limits the available resolution in the deflection direction. Thus, there is a chromatic aberration, i.e. a variation, with respect to the beam energy, of the location at which the primary beam hits the specimen. Here, a first-order chromatic aberration of the electron beam apparatus is defined as the first derivative, with respect to the beam energy, of the location at which the primary beam strikes the specimen, at the main beam energy.

In summary, with the apparatus of FIG. 5 the location of the beam striking the specimen is energy (momentum) dependent, causing the beam to be widened in the deflection direction perpendicular to the optical axis.

In the following, the embodiments of the invention are described which reduce the undesirable effects mentioned with respect to the above-described illustrative example of FIG. 5, and at the same time add a capability for tilting the electron beam. Within the following description of the drawings, reference numbers having the same last two digits refer to the same or similar components. Generally, only the differences with respect to the individual embodiments are described, so that the description of any one embodiment can also be applied to another embodiment, unless otherwise stated. In particular any feature indicated as being preferred or advantageous is optional. Also, such a feature indicated as being preferred or advantageous may be combined with any other feature or features indicated as being preferred or advantageous.

Figure 1A:
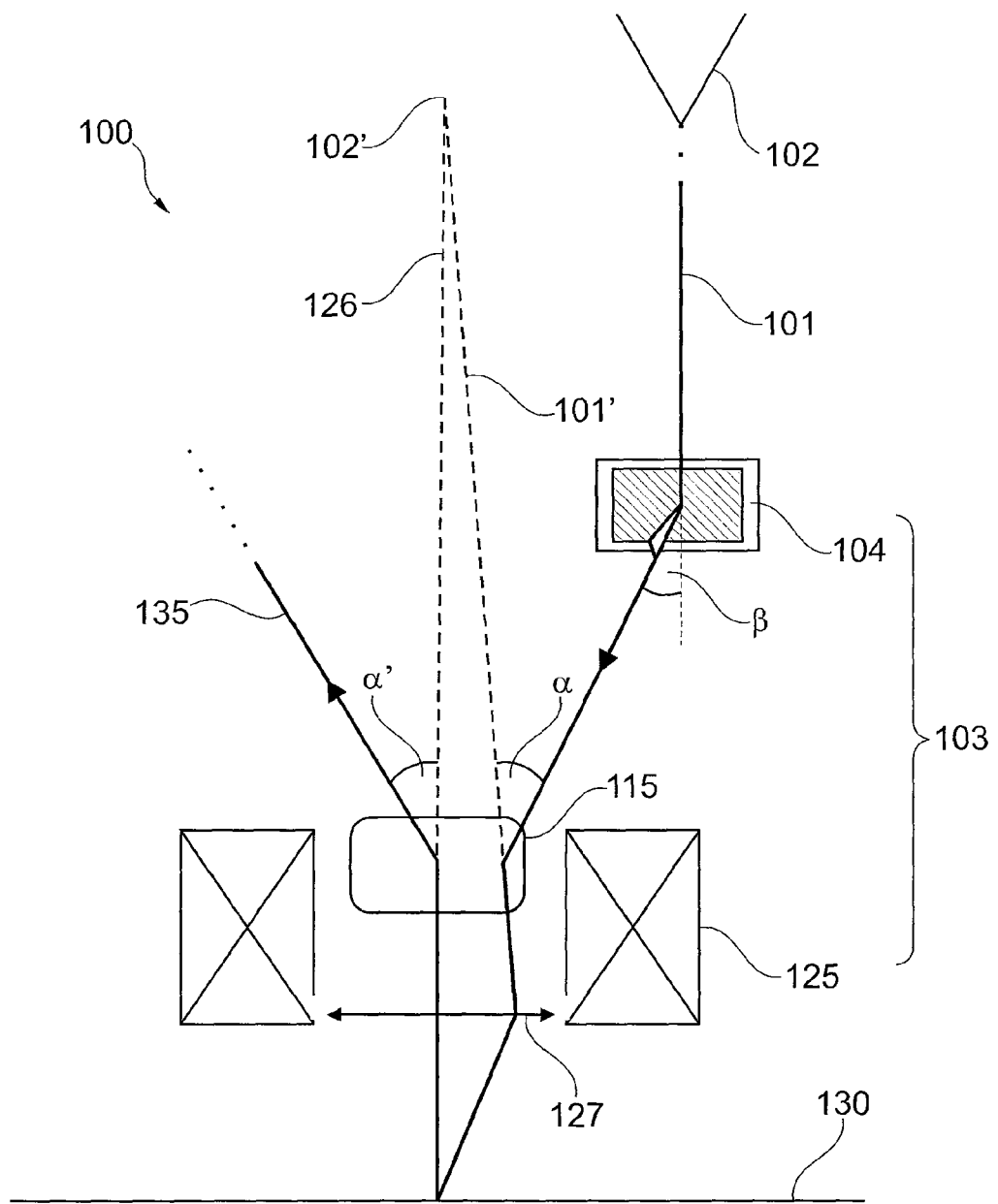
FIGS. 1a and 1b show schematic side views of an electron beam apparatus according to a first embodiment, viewed from a first side and from a second side, respectively.
Figure 1B:
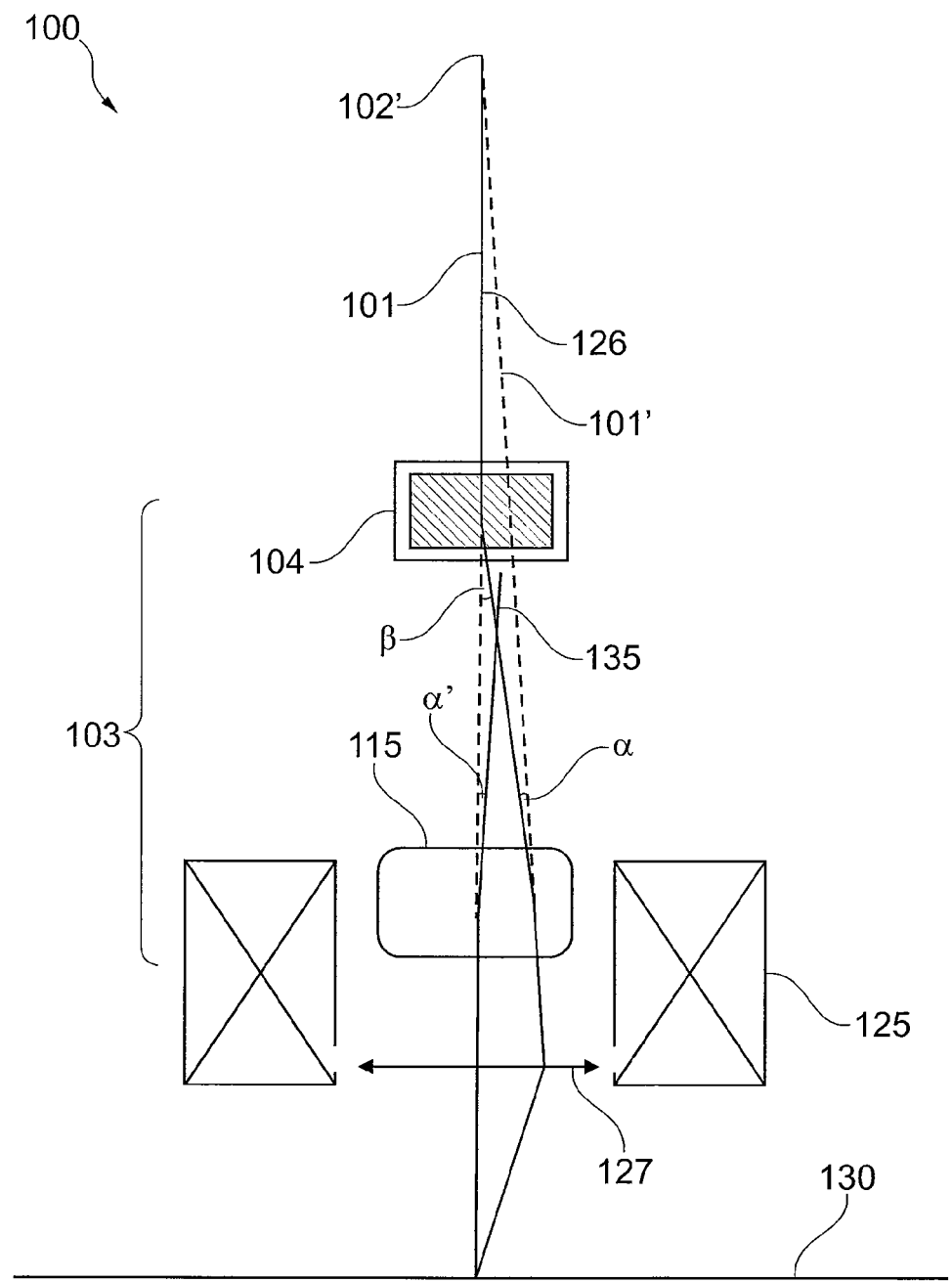

FIGS. 1a and 1b show an electron beam device according to a first embodiment of the invention, viewed from two different sides. The electron beam device 100 includes a beam emitter 102 for emitting a primary electron beam 101, and an objective electron lens 127 for focusing the primary electron beam 101 onto a specimen 130, wherein the objective lens defines an optical axis 126. A specimen, as referred to herein, includes, but is not limited to, semiconductor wafers, semiconductor workpieces, and other workpieces such as optical blanks, memory disks and the like. Embodiments of the invention may be applied to any workpiece onto which material is deposited or which are structured. A specimen includes a flat surface to be structured or onto which layers are deposited, an opposing surface, an edge, and typically a bevel. The objective lens 127 is a final focusing lens.

The optical axis 126 is laterally displaced from the beam source 102. FIG. 1a shows the beam apparatus 100 from a side such that the image plane of FIG. 1a is parallel to the plane spanned by the optical axis 126 and the beam source 102. FIG. 1b, on the other hand, is a view from an orthogonal side, i.e. such that the image plane of FIG. 1b is orthogonal to the plane spanned by the optical axis 126 and the beam source 102. Therefore, in the view of FIG. 1b, the optical axis 126 and the beam source 102 are aligned.

In FIGS. 1a and 1b, the lens 127 is indicated as the region of a focusing lens field (electrostatic, magnetic, or combined electrostatic/magnetic) for focusing the beam on the specimen. The lens body 127 further includes elements for generating the focusing field and possibly further related elements in a body having a lens bore for the electron beam. However, as used in the following, the term "lens" may in some cases also refer to at least some elements of the lens body 125. The lens may be a multiple-element lens such as a combined electrostatic-magnetic lens provided in a common lens housing. In FIG. 1a, only the magnetic portion of the combined electrostatic-magnetic lens is shown. Alternatively, the lens may be e.g. an electrostatic lens. As a general aspect independent of the shown embodiment, the objective lens may be arranged at a distance of less than 100 mm or even less than 50 mm, and/or less than ¼ of the total primary beam length, from the specimen (specimen plane).

The electron beam device 100 further includes a beam separator 115. The beam separator 115 is a magnetic beam separator, and in particular may be a purely-magnetic beam separator. The beam separator 115 may be enclosed within the body of the objective lens 127, e.g. located essentially ("essentially" meaning by more than half of the beam separator's length along the optical axis) within or downstream of the body, in particular at least partially within or downstream of a bore of the objective lens 127. Also, especially in the case of an electrostatic lens, the beam separator 115 may be located upstream of the objective lens 127. The beam separator 115 may be located directly upstream of the objective lens 127, i.e. with essentially no other electron-optical element between the beam separator 115 and the objective lens 127, along the electron beam path 101. Alternatively e.g. a beam scanner, such as a magnetic and/or electrostatic scanner, may be arranged along the beam path between beam separator 115 and the objective lens 127.

The magnetic beam separator 115 has a first dispersion. Here, an element having a dispersion (or dispersion relation) means that the element is adapted for acting on the electron beam according to the dispersion (dispersion relation), i.e. to deflect electrons of the beam by a deflection angle which is dependent upon the electron energy or momentum. The first dispersion is anisotropic and defines a first dispersion or deflection direction (the direction in which the beam is deflected in FIGS. 1a and 1b, which is orthogonal to the optical axis 126).

Due to the first dispersion, the magnetic beam separator 115 is able to separate a signal electron beam 135 from the primary electron beam 101 (according to their non-equal momentums or directions). Here, signal electrons are defined as electrons travelling in an essentially opposite direction from the primary beam electrons, and the signal electrons may, in particular, include secondary electrons, auger electrons, and/or backscattered electrons.

In more detail, here the beam separator 115 is a deflector having a magnetic deflection coil for deflecting the primary electron beam 101. The deflection coil generates a transverse magnetic field for separating the signal electron beam 135 from the primary electron beam 101. The transverse field is orthogonal to the optical axis and to the deflection direction. When the electrons of the beams 101 and 135 traverse the magnetic field, they experience a force which is dependent upon the electron velocity (Lorentz force law). Since the primary electrons (beam 101) and signal electrons (beam 135) are essentially traveling in opposite directions, the forces acting upon the two beams will be opposite in direction when traveling through the transverse magnetic field. Thus, the primary beam 101 and the secondary beam 135 are both deflected in opposite directions, namely by respective angles alpha and alpha' of opposite sign.

The beam separation deflector 115 is adapted for deflecting the beam in two directions orthogonal to the optical axis (in the image plane of both FIGS. 1a and 1b). Thus, the beam separation deflector 115 defines a separation deflection direction, which is the direction in which the beam is deflected in the absence of a tilt. In this case, the separation deflection direction is in the image plane of FIG. 1a.

In particular, the magnetic beam separator or beam separating deflector may be a purely magnetic beam separator, i.e. it includes a magnetic element (e.g. magnetic coil or dipole element) as the only deflecting element, and no other, e.g. electrostatic, deflecting element. In this case, the electron beam device 100 is configured such that no electrostatic deflecting field acts on the primary beam 101 at the location of the beam separator 115 (as would be the case, for example, for a Wien filter). With a purely magnetic deflector, the primary electron beam 101 and the secondary electron beam 135 both experience approximately equal deflection strengths. Hence, if the primary and the secondary electrons have similar energies, the angles alpha and alpha' of FIG. 1a have approximately the same magnitude, and also the angles alpha and alpha' of FIG. 1b have approximately the same magnitude.

Using a purely magnetic deflector as the beam separator 115 has the advantage that the region inside the objective lens 127 can be kept free of parts that require intensive servicing. For example, electrostatic deflectors are prone to contamination and therefore require frequent servicing. By having a dispersion compensation element 104, described below, upstream of the beam separator 115, the latter can have a simple construction which does not require serviceable parts. This allows the beam separator 115 to be enclosed within the body of the objective lens, which is difficult to access for servicing.

As a further general aspect, the beam separator 115 is a deflector which induces a deflection angle which smoothly (continuously or even differentiably) depends on the beam energy of the primary beam 101. Hence, the deflector is different from an energy filter which only allows electrons above a certain threshold energy to pass. As a further general aspect, the beam separator 115 deflects the primary electrons in a direction which is essentially along the optical axis defined by the objective lens.

The electron beam device 100 further includes a dispersion compensation element 104. The dispersion compensation element 104 is arranged upstream, along the primary electron beam 101, of the beam separator 115. As an aspect of the invention independent of the shown embodiment, the secondary electrons do not reach the dispersion compensation element 104, in other words the dispersion compensation element 104 is arranged outside of the signal electron beam 135 path of the electron beam device 100, such that it influences only the primary beam and has no direct influence on the signal electron beam 135. Some possible realizations of the dispersion compensation element 104 are described in more detail further below with reference to FIGS. 2 and 4a to 4l. The dispersion compensation element 104 of FIGS. 1a, 1b may be realized according to any one of these Figures, e.g. according to FIG. 4a described further below.

For example, according to an embodiment, the dispersion compensation element 104 may comprise a magnetic deflector and an electrostatic deflector with overlapping fields in a Wien Filter-like arrangement, so that the electron beam 101 is deflected by two deflectors of different dispersion. This arrangement allows the adjustment of the deflection angle beta of the electron beam 101 traversing the dispersion compensation element 104 by selecting the sum of the deflection strengths of the two deflectors appropriately and adjusting the dispersion independently from the deflection by selecting appropriate individual contributions of the two deflectors to the total deflection.

Independently from the shown embodiment, the dispersion compensation element 104 may allow the selection of a dispersion in the two directions orthogonal to the optical axis independently from one another. This can be achieved by adapting the deflectors of the Wien Filter-like arrangement for deflecting the beam in the two directions orthogonal to the optical axis independently from one another.

The dispersion compensation element 104 and the beam separation deflector 115 deflect the primary beam 101 by angles beta and alpha, respectively. Alpha and beta may have components in the image planes of both FIGS. 1a and 1b, and the following applies to at least the component in the image plane of FIG. 1a but generally to the components in both image planes. The angles beta and alpha are adjusted such that the primary electron beam 101 enters the electron lens 127 at an offset from the optical axis 126 seemingly emerging from a virtual source 102', as is indicated in FIGS. 1a and 1b by the virtual beam path 101' of the beam 101 entering the lens 127. The virtual source 102' is located approximately on the optical axis 126. Consequently, the objective electron lens 127 focuses the offset primary electron beam 101 onto the specimen 130, thereby directing the primary electron beam 101 to hit the specimen 130 at an oblique beam landing angle depending on the offset. Thus, by adjusting the angles alpha and beta appropriately, the offset is adjusted, and thereby, in turn, the beam landing angle is adjusted. Hereby, the location of the virtual source 102' is virtually independent of the adjusted offset. The dispersion compensation element 104 and the beam separation deflector 115 thus form, together, a beam tilting arrangement 103 for directing the primary electron beam 101 to the electron lens 127 at an adjustable offset from the optical axis.

Both the dispersion compensation element 104 and the beam separation deflector 115 are adapted to deflect the beam in two directions, namely in a first tilting direction in the image plane of FIG. 1a (parallel to the separation deflection direction) and in the orthogonal direction in the image plane of FIG. 1b (orthogonal to the separation deflection direction). Thereby, the beam tilting arrangement 103 is enabled for tilting the beam in two dimensions orthogonal to the optical axis. Thereby, the beam landing angle is adjustable in these two directions.

The deflection in the image plane of FIG. 1b, however, is generally much less than the deflection in the image plane of FIG. 1a: A non-tilted beam is even deflected only in the direction of the image plane of FIG. 1a, as described above, but not at all in the plane of FIG. 1b. Therefore, in the direction of the image plane of FIG. 1b, only the additional deflection for the tilting needs to be applied.

When the objective electron lens 127 focuses the offset primary electron beam 101 onto the specimen 130, a chromatic aberration of the primary electron beam is caused by the offset. Due to the chromatic aberration, a higher-energy portion of the primary electron beam 101 is deflected by the electron lens differently than a lower-energy portion of the primary electron beam 101. Namely, the higher-energy portion of beam 101 is deflected less the lower-energy portion of beam 101. This effect of the chromatic aberration is very similar to the dispersion caused by the beam separator 115. In fact, both the dispersion and the chromatic aberration result in portions of beam 101 with different energies striking the sample 130 at different locations, whereby the beam would be blurred and the resolution would be decreased. Therefore, at least to first-order, both the first dispersion and the chromatic aberration described above have the same effect. This effect can be expressed e.g. by defining the beam aberration as the derivative $dx_1/dE$, where $x_1$ are the coordinates of the spot at which a beam portion of energy E lands on the specimen. The term $x_1$, and hence the a beam aberration $dx_1/dE$, is a two-dimensional vector.

Continuing the description of FIGS. 1a and 1b, the dispersion compensation element 104 has a second dispersion, also referred to as a compensation dispersion, i.e. the dispersion compensation element is adapted for acting on the primary beam according to the second dispersion. Herein, the labels "first", "second" do not imply any order along the beam path.

Further, the dispersion compensation element 104 allows for the adjustment of the second dispersion. In some embodiments, the second dispersion is independently adjustable in two dimensions as described above. More particularly, the second dispersion can be adjusted such that the second dispersion substantially compensates for the beam aberration $dx_1/dE$ resulting from the first dispersion and from the chromatic aberration. This compensation is to be understood as follows: By adjusting the second dispersion of the dispersion compensation element 104, it is possible to change the beam aberration $dx_1/dE$ described above. This allows for substantial compensation of the beam aberration of the type described above, i.e. resulting from the first dispersion and from the chromatic aberration. The beam aberration resulting from the first dispersion and from the chromatic aberration may also include other contributions to the dispersion-like aberration which can be described by an energy-dependence of the type $dx_1/dE$. According to the compensating of this beam aberration, the apparatus is enabled for reducing the (first-order) aberration so that it can be reduced substantially close to zero (when used in practice, there may be a residual aberration if the compensation is not perfectly adjusted, as well as higher-order errors). Here substantially close to zero means that the beam widening due to this aberration is at least considerably reduced, compared to the case in which the second dispersion is not adjusted, so that the beam aberration of the above type is negligible compared to other types of errors such as an aspheric error or some other error. Thus, the dispersion compensation element 104 allows for the adjustment of the second dispersion (compensation dispersion) such that the above-mentioned beam aberration can be brought to zero or close to zero. In consequence, the mean beam width can be reduced considerably.

While the adjustment of the second dispersion allows for compensation of the above-described beam aberration such as to give an aberration substantially close to zero (substantially reduced), there may be applications in which some pre-determined energy-dependence of the electron beam striking the specimen is actually desired. In this case the dispersion compensation element may also be controlled in such a way that this pre-determined energy-dependence is achieved.

In the apparatus of FIGS. 1a and 1b, the adjustment of the second dispersion can be performed automatically by a dispersion compensation controller (as shown e.g. in FIG. 3b) or by manual adjustment. The adjustment can also be performed e.g. during setup of the apparatus, and the adjusted dispersion is then hard-wired into the control of the dispersion compensation element 104.

Further, the dispersion compensation element 104 is adapted for adjusting the second dispersion independently of an inclination angle of the primary beam 101 downstream of the dispersion compensation element 104. In other words, the dispersion compensation element 104 is adapted for adjusting the second dispersion without substantially affecting the inclination angle of the primary beam 101 path downstream of the dispersion compensation element 104. The inclination angle is defined relative to the optical axis 126. Further, the dispersion compensation element 104 may be adapted for adjusting the inclination angle of the primary beam 101 downstream of the dispersion compensation element 104 independently of the second dispersion.

The dispersion compensation element 104 may be adapted for adjusting the second dispersion relation independently of the entire path of the primary beam 101 from the emitter to the specimen 130; i.e. the dispersion compensation element acts in a dispersive manner without significantly affecting the path of the entire primary beam 101 (this is the case in FIGS. 1a to 3b).

Within this description, the apparatus may be adapted to perform the functions described herein e.g. by implementing a controller that is programmed, hard-wired, or in any other manner adapted for achieving that function. The controller may be provided as an electronic controller, in particular as a digital controller, but also e.g. as an electrical circuit or by mechanical coupling elements, to achieve the desired function.

Clearly, the path-independent adjustment is only possible for primary beam electrons of a particular energy at or near the main beam energy: Due to the second dispersion, the inclination angle of the primary beam path downstream of the dispersion compensation element will depend on the beam energy. "Without substantially affecting the inclination angle" therefore means that there is an energy at or near the main beam energy of beam 101 (e.g. an energy away from the mean beam energy by less than five times or even less than two times of the beam energy width), at which energy the inclination angle is not affected noticeably when adjusting the second dispersion by a small amount (e.g. to first-order).

Thus, in the electron beam device 100 of FIGS. 1a and 1b, the primary electron beam 101 from the emitter 102 passes through the dispersion compensation element 104 and undergoes the second dispersion. Simultaneously, the primary beam 101 may be deflected (as shown in FIGS. 1a and 1b). The primary beam 101 leaves the dispersion compensation element 104 at an inclined angle with respect to the optical axis 126, and is received in the beam separator 115 at the inclined angle. The inclination angle of the primary electron beam 101 directly upstream of the beam separator 115 is generally non-zero and its value depends on the respective application.

The primary electron beam 101 then passes through the magnetic beam separator 115 and is deflected therein, such that the primary electron beam 101 is directed to the electron lens 127 at an offset from the optical axis 126 and seemingly emerging from the virtual source 102'. Simultaneously, the primary beam 101 undergoes the first dispersion. The primary electron beam 101 is then focused by the objective lens 127 to strike the sample 130, such as a semiconductor wafer. Due to the offset, the objective electron lens 127 directs the electron beam 101 to hit the specimen 130 at an oblique beam landing angle. A chromatic aberration is caused by the offset. Because both the chromatic aberration and the first dispersion have been compensated by the second dispersion, the beam 101 strikes the sample 130 with high resolution.

The secondary electron beam 135 resulting from the interaction of the primary beam 101 with the sample 130 passes once more through the objective lens 127, but in the opposite direction, is deflected at an angle alpha' as it passes through the magnetic beam separator 115 and is thereby separated from the primary beam 101 (as described above). The secondary electron beam 135, after having been separated from the primary beam 101, is then guided to an electron detector (by elements not shown in FIG. 1).

The device of FIGS. 1a and 1b has the further advantage that it allows the use of a high-intensity beam, and therefore enables fast inspection at high throughput with a good signal-to-noise ratio: Namely, because the beam separator 115 is enclosed within the body of the objective lens 127, the common path for the primary beam 101 and the secondary beam 135 is very short. Thereby, inter-beam electron-electron interactions (i.e. interactions between electrons of the primary beam 101 and electrons of the secondary beam 135) are reduced.

The effect of such inter-beam interactions has previously not been significantly accounted for. However, the inventors have found indirect but convincing evidence indicating that such inter-beam interactions have a significant negative effect on image quality: Namely, in an apparatus such as the one shown in FIG. 1, and at large beam intensities and energies, an extra contribution to the blurring of the primary beam 101 was found. This extra contribution can be explained by the fact that the inter-beam interactions involve head-on electron-electron collisions. These collisions cause undesired beam widening and are detrimental to the attainable resolution. The head-on collisions are therefore expected to be particularly detrimental at high beam energies and intensities.

This extra contribution to blurring was reduced when the common beam path was made shorter. Namely, by shortening the path at which such head-on collisions can occur (i.e. the common beam path between the primary beam 101 and the signal electron beam 135), the beam intensity can be increased whilst the level of head-on collisions remains constant. The short common beam path can be achieved by the beam separator 115 being enclosed within the body of the objective lens 127, or being arranged directly upstream or downstream of the objective lens. Thereby, the distance to the beam separator 115 from a specimen plane 131 (plane at which the electron beam hits the specimen 130) can be made less than 100 mm, and in some embodiments even less than 70 mm or even 50 mm, such that the common path of the primary and secondary electron beams is less than 100 mm, 70 mm or 50 mm. Also, the common path of the primary and secondary electron beams may be made shorter than 25% of the total primary beam length, i.e. the primary beam length from the electron source to the specimen. The high-intensity beam thus obtainable enables a fast inspection at high throughput and with a good signal-to-noise ratio.

In summary, the apparatus of FIGS. 1a and 1b minimizes the collision length of the primary and secondary electron beams, enabling high-intensity operation at high spatial resolution.

The apparatus of FIGS. 1a and 1b may have additional elements such as a condenser lens e.g. upstream the objective lens and in particular upstream of the dispersion compensation element.

The setup of FIGS. 1a and 1b allows for the tilting of the electron beam 101 and compensating for a dispersion as well as a chromatic aberration in a short and compact column with minimal electron-electron interactions. However, the setup of FIG. 1a requires adjustment of the angle alpha by which the primary beam 101 is deflected in the beam separator 115 in order to obtain the desired tilt. Therefore, the angle alpha' by which the signal electron beam 135 is deflected will also depend on the tilt. Consequently, the direction of the secondary beam entering a secondary beam detector will depend on the tilt. This can be useful because differently tilted beams can be distinguished by the location at which they strike the detector. However, in some cases, it is desired to visualize differently tilted beams on the same detector location, irrespective of the tilt.

This problem is especially clear from FIG. 1b. Here, if non-tilted, the first and secondary beams 101, 135 would essentially travel in line with the optical axis when seen in FIG. 1b, i.e. when projected onto the image plane of FIG. 1b. In particular, the secondary beam 135 would exit the beam separator without departing laterally from the optical axis 126 when seen in FIG. 1b. However, because the beam separation deflector 115, acting as the second stage of a two-stage deflector, needs to deflect the primary beam 101 by an adjustable angle in order to direct it on the path having an adjustable offset and seemingly emerging from the optical source 102', and because the secondary beam 135 is deflected by an angle alpha' of opposite sign and approximately equal magnitude to alpha, the deflection angle alpha' thus depends on the offset or tilt. Therefore, the signal beam 135 exits at an angle, and this angle is dependent on the tilt.

In order to eliminate or at least reduce the dependency of the direction of the signal beam 135 on the tilt, a further secondary beam deflection arrangement can be provided downstream, in the secondary beam propagation direction, of the beam separator 115 so that the secondary beam deflection arrangement influences only the secondary beam 135, and not the primary beam 101. Thus, the secondary beam deflection arrangement can be controlled for additional deflection of the secondary beam so that the outgoing secondary beam is not dependent on the tilt. However, such an arrangement may be costly and inaccurate.

Figure 2:
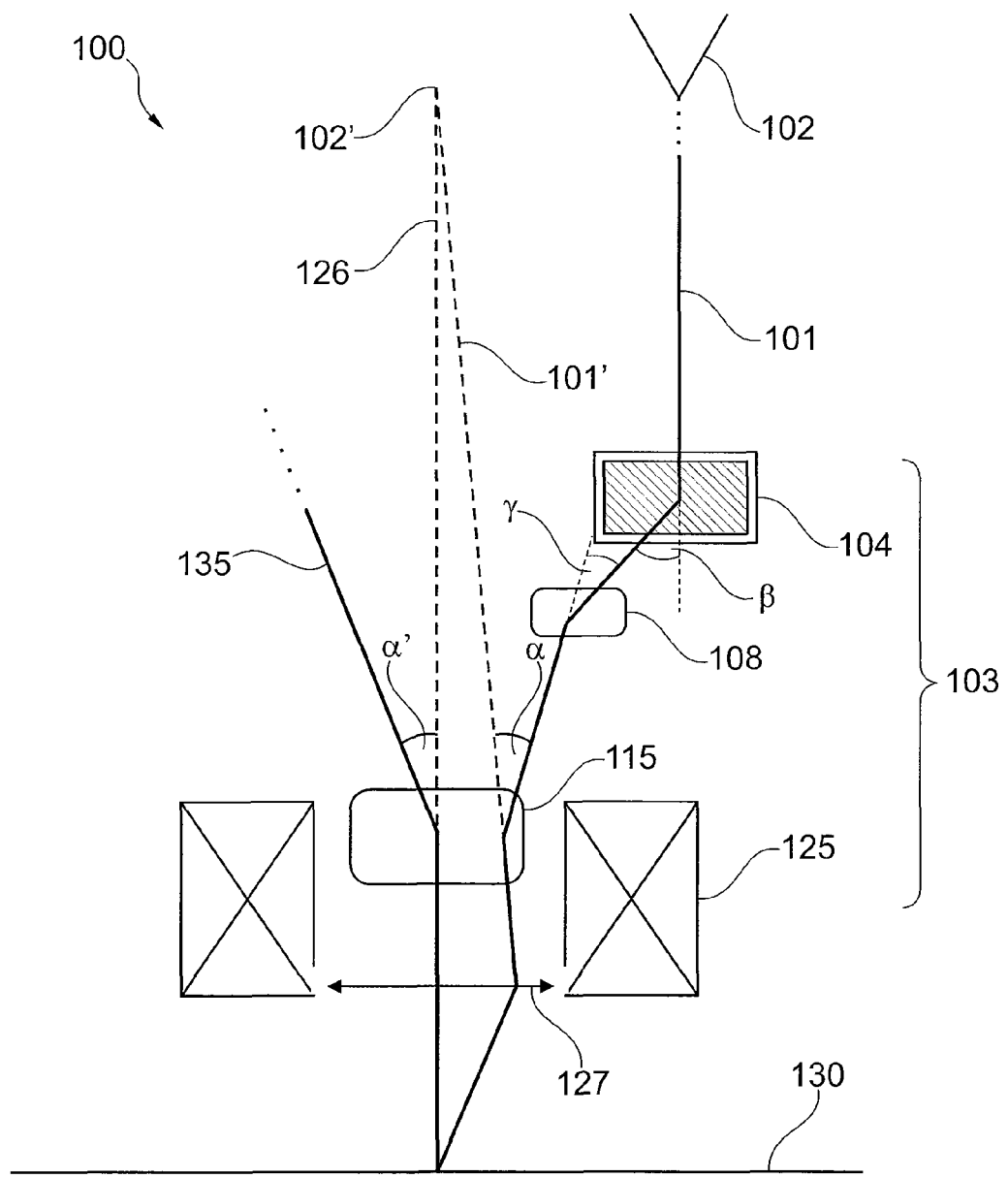
FIG. 2 shows a schematic side view of an electron beam apparatus according to a further embodiment.

An alternative solution is given in the embodiment of FIG. 2, which is described in the following. The apparatus of FIG. 2 allows for a desired tilt of the primary beam 101 independent of the deflection angle alpha' of the signal beam 135. In FIG. 2, and in the following description, the same reference numbers as in FIG. 1 refer to the same or analogous components, and only the differences with respect to FIG. 1 are described. The more general description of FIG. 1 also applies to the embodiment of FIG. 2.

In FIG. 2, an additional deflector 108 is provided along the primary beam 101 path between the dispersion compensation element (deflector) 104 and the beam separation deflector 115. The deflectors 104 and 108 form a beam pre-tilting deflector arrangement positioned upstream of the beam separation deflector. The deflectors 104 and 108 are adapted for deflecting the beam 101 in two directions orthogonal to the optical axis, namely within the image plane of FIG. 2 and in the direction orthogonal to the image plane. The beam separation deflector 115 is adapted to deflect the beam 101 within the image plane of FIG. 2.

The deflector 104 deflects the primary electron beam 101 by an angle beta; the deflector 108 by an angle gamma; and the deflector 115 by an angle alpha. In the embodiment of FIG. 2, the deflection angle alpha, by which the beam separation deflector 115 deflects the beam 101, can remain constant, i.e. remaining independent of the desired tilt. The deflectors 104 and 108 deflect the beam with dependence on the desired tilt, so that the offset corresponding to the tilt is achieved while the beam seemingly emerges from the virtual source 102' upon reaching the electron lens 127, the position of the virtual source 102' being independent of the adjusted offset/tilt. Herein, the further deflection by the deflector 115 (by substantially fixed angle alpha) is taken into account, i.e. the above-described path is achieved by the combined action of the deflectors 104, 108 and 125. By themselves (i.e. before deflection by deflector 125), the deflectors 104 and 108 deflect the beam such that it appears to emerge from a virtual source corresponding to the virtual source 102' rotated about the deflector 115 by an angle alpha. In this manner, after the deflection by the deflector 115, the beam appears to emerge from the virtual source 102', and has the desired offset. In this manner, the beam pre-tilting achieves different offsets while the beam separation deflector 115 deflects the primary beam 101 by a deflection strength independent of the tilting, i.e. at the predefined beam separation deflection angle alpha. Thereby, the deflection strength of the beam separation deflector 115 acting on the signal electrons 135 is independent of the tilting.

The tilting or beam landing angle is adjustable, by the deflectors 104 and 108, in two directions orthogonal to the optical axis, namely within the image plane of FIG. 2 and in the direction orthogonal to this image plane.

With reference to FIGS. 3a to 4l, further embodiments will now be described. Except the differences described herein and possibly other obvious differences, the description of FIGS. 1a, 1b and 2 also applies to these further embodiments, whereby the elements having reference numbers of the form "2xx" correspond to the corresponding elements of FIGS. 1a, 1b and 2 having reference numbers of the form "1xx".

Figure 3A:
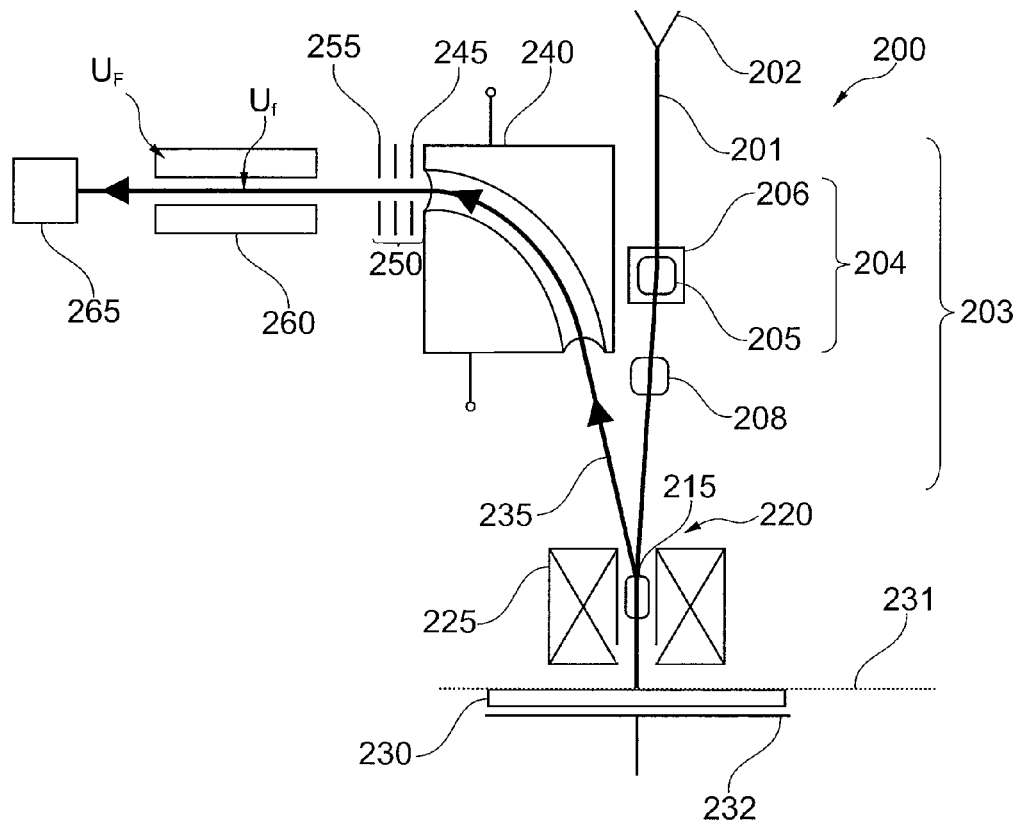
FIGS. 3a and 3b show schematic side views of an electron beam apparatus according to a further embodiment.

In the electron beam apparatus (e.g. SEM) 200 of FIG. 3a, the dispersion compensation element 204 includes a magnetic coil (magnetic deflector) 205 and an electric (electrostatic) deflector 206, both deflectors 205 and 206 being adapted to deflect the beam 201 within the same deflection plane (here, the deflection plane, i.e. the plane within which the beam is deflected, is the drawing plane of FIG. 3a). Further, at least one but possibly both of the deflectors 205 and 206 are adapted for deflecting the beam in the plane orthogonal to the drawing plane of FIG. 3a. Further, the deflectors 205 and 206 are connected to a control apparatus 270 which is described in more detail below. In FIG. 3a, the total deflection D of the dispersion compensation element 204 is chosen so as to obtain the angle beta shown in FIG. 2, i.e. the appropriate angle for achieving an adjusted tilt.

Further to the description of FIG. 2, FIG. 3a includes some additional elements of the electron beam apparatus 200 (these elements may also, but do not need to, be present in the embodiment of FIGS. 1a, 1b and 2): Namely, the apparatus 200 of FIG. 3a includes collecting arrangement (elements arranged along the beam path of the signal beam 235). Further, the apparatus 200 has a specimen receiver 232 defining a specimen plane 231 at which the specimen 230 interacts with the electron beam 201.

In the electron beam apparatus 200 of FIG. 3a, the primary electron beam 201 travels as described with respect to FIG. 2. The resulting signal electron beam 235, after having been separated from the primary beam 201 by the beam separator 215 and is then guided to an electron detector 265 as described e.g. in U.S. Pat. No. 7,335,894 (see FIG. 5 and col. 9 line 57 to col. 10 line 56 thereof). The signal electron beam 235 could alternatively be guided to the detector in any other manner.

The electron beam device 200 further includes a specimen receiver 232 for receiving the specimen 230. The specimen receiver 232 defines a specimen plane 231 at which the specimen 230 interacts with the electron beam 201 during operation of the electron beam device 200.

The electron beam device 200 of FIG. 3a may include further elements not shown in FIG. 3a. For example, the electron beam device 200 may include an energy filter for the primary electron beam 201, a beam boost electrode for accelerating the electron beam 201, and/or a scan system for scanning the beam 201 over the specimen. The scan system may include e.g. electrostatic deflection plates or magnetic deflection coils or a combination thereof. For example, the scan system may include between 4 and 16 electrostatic deflection plates, e.g. 8 electrostatic deflection plates. Also, the scan system may include at least two deflection coils (at least one coil for each scanning direction in the specimen plane). The scan system is generally located downstream of the beam separator 215, i.e. inside or downstream of the objective lens 227, and can be (partially) integrated into the lens body 225.

The scan system may, in particular, include an aspherically acting element such as an electrostatic, magnetic, or combined octopole element. The aspherically acting element may then also be used to compensate for a spherical error and/or to compensate for a lens astigmatism.

Figure 3B:
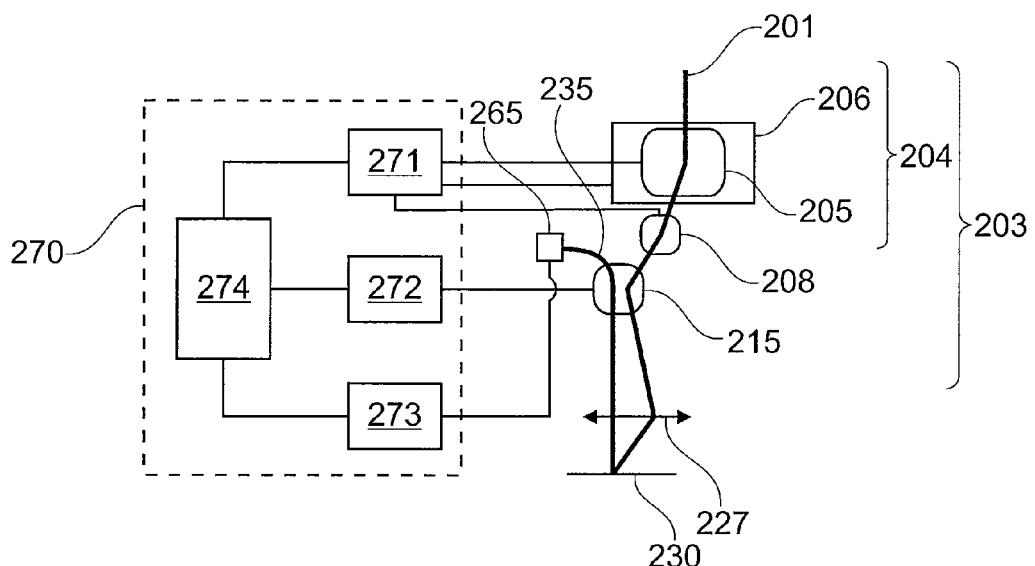

FIG. 3b shows the apparatus of FIG. 3a (with some optional elements omitted), and additionally a controller 270. The controller 270 is configured to perform the following tasks:

(i) obtaining an adjustable offset parameter (value or some other parameter related to the adjustable offset);
(ii) adjusting the respective deflection angles beta and gamma (see FIG. 2) for directing the electron beam 201 to strike the specimen 230 at an adjustable oblique beam landing angle corresponding to the offset; and
(iii) adjusting the compensation dispersion of the primary electron beam 201 appropriately.

An example of how these tasks are implemented in the controller 270 is given further below.

To this purpose, the controller 270 has a dispersion compensation and tilt controller 271 connected to the pre-tilt deflection arrangement including the dispersion compensation deflector 204 and the further deflector 208, a beam separation controller 272 connected to the beam separation element 215, an optional beam analyser 273 connected to the electron detector 265, and a main controller unit 274 connected to the controllers 271, 272 and 273. The above units are distinguished from each other merely by their functions, and different units may be implemented on the same hardware or even in the same software routine running on such hardware.

As a general aspect independent of the shown embodiment, the dispersion compensation and tilt controller 271 is connected to the dispersion compensation element 204 and programmed, hard-wired or in any other way adapted to adjust the second dispersion independently of an inclination angle of the primary beam 201 downstream of the dispersion compensation element 204. So, in the example shown in FIG. 2b, the dispersion compensation and tilt controller 271 is adapted for adjusting the deflections d1, d2 of the deflectors 205 and 206 such that their total deflection D=d1+d2 is held constant at a predetermined deflection.

According to one mode of operation, the controller 270 is adapted for operation according to a predetermined beam separation deflection of the beam separation element 215 and to an adjusted tilt, as follows: The main controller unit 274 obtains an adjustable offset parameter, according to task (i) mentioned above, for example, from a manual input such as a keyboard or knob, from a network interface connected to a remote device, and/or from commands issued by a computer program or function. Instead of the adjustable offset, some other parameter can be obtained that is related to the offset, such as e.g. a desired tilt angle of the beam impinging on the sample or a functionally-related parameter.

The main controller unit 274 supplies the predetermined beam separation deflection to the beam separation controller 272, and the beam separation controller 272 controls the beam separation element 215 to cause the beams 201 and 235 to be deflected by the predetermined beam separation deflection, thereby causing a first dispersion of the beam 201.

The main controller unit 274 then adjusts the respective deflection angles (see task (ii) above) as follows: The angle alpha (see FIG. 2) is pre-determined and stored in the main controller unit 274. The main controller unit 274 sets the angles beta, gamma (see FIG. 2) such that by the combined action of deflections by angles alpha, beta, gamma, as shown in FIG. 2, the primary beam 201 is directed to the electron lens 227 at an offset from the optical axis 226 corresponding to the offset value of task (i), and that the beam 201 seemingly emerges from the virtual electron source 202'. Herein, the angles beta, gamma (understood to also cover quantities functionally related to these angles) may be, for example, calculated using the model described above in connection with FIG. 2, or obtained from a table stored in the main controller unit 274.

Then, the main controller unit 274 communicates angles beta, gamma to the dispersion compensation and tilt controller 271, which in turn controls the deflectors 204, 208 such that they deflect the beam 201 by the respective angles beta and gamma. The beam separation controller 272 controls the beam separation deflector 215 such that it reflects the beam 201 by the angle alpha. This results in the objective electron lens 227 directing the electron beam 201 to strike the specimen 230 at the beam landing angle corresponding to the offset.

The main controller unit 274 then determines an appropriate compensation dispersion, which substantially compensates for the beam aberration resulting from a first dispersion (caused by the respective deflections by angles beta, gamma and alpha) and from the chromatic aberration (caused by the offset from the optical axis), see task (iii). The main controller then transmits the compensation dispersion to the dispersion compensation and tilt controller 271. The dispersion compensation and tilt controller then causes the dispersion compensation element 204 to achieve the compensation dispersion. Namely, the dispersion compensation and tilt controller 271 adjusts the compensation dispersion of the primary electron beam 201 due to the compensation element 204, by adjusting the individual contributions of the deflectors 205 and 206, as described further above.

The main controller unit 274 may determine the appropriate compensation dispersion by various methods. For example, according to a feedback control loop, the beam analyzer 273 receives image information from the electron detector 265 and generates an image quality signal therefrom (e.g. a spot-size indicative signal). The main controller unit 274 then receives the image quality signal from the beam analyzer 273 for various compensation dispersions and then selects the appropriate compensation dispersion according to the image quality signal. Alternatively, the main controller unit 274 may calculate an appropriate compensation dispersion based on a model of the beam such as the model illustrated in FIG. 2. The criterion should be that the total beam aberration of the beam striking on the specimen should be zero according to a model of the electron beam propagation, wherein the total beam aberration contains at least the sum of the following first-order contributions:

$$A_{total} = A_{first} + A_{chromatic} + A_{compensation}.$$

Here, $A_{first}$ is the first-order contribution to the beam aberration resulting from a first dispersion (caused by the respective deflections by angles beta, gamma and alpha), $A_{chromatic}$ is the first-order contribution from the chromatic aberration (caused by the offset from the optical axis), and $A_{compensation}$ is the first-order contribution from the compensation dispersion. Alternatively, the main controller unit 274 may obtain the appropriate second dispersion from a stored table of appropriate values for various parameters.

The controller 270 of FIG. 3b is adapted for the embodiment of FIGS. 3a and 3b. However, it is clear that by including some variations, the controller 270 may be adapted for any other embodiments shown or claimed herein, e.g. the embodiments of FIGS. 4a to 4l.

Further, while the dispersion compensation element of the embodiments of FIG. 1a, 1b, 2, 3a or 3b is suitable for adjusting the dispersion such that the total dispersion (first-order chromatic aberration) is zero, the apparatus does not necessarily need to operate in this manner. Instead, it may be sufficient to implement some approximate control of the dispersion compensation element, such that the total dispersion is sufficiently close to zero to achieve a desired resolution. Alternatively, a beam having a particular total dispersion may be desired for some applications. In this case, the dispersion of the dispersion compensation element 104 can be adjusted to provide the desired total dispersion (which may be zero or non-zero).

In FIGS. 4a to 4l, possible realizations of the beam tilting arrangement 103 including the dispersion compensation element 104 are illustrated. Any of these elements can be used in place of the beam tilting arrangement 103/203 of FIGS. 1a to 3b. Where it is indicated that the elements are similar to other elements, the description of these other elements also applies to FIG. 4d unless specified otherwise or unless contradictory to the description or the Figures.

Generally, the dispersion compensation element 104 may be equipped with two deflectors, e.g. an electric and a magnetic deflector, whose individual deflections (individual contributions, denoted as d1 and d2, respectively, to the total deflection of beam 101 at or near the main beam energy) are controlled such that the total deflection D=d1+d2 remains constant. Thus, the contribution of one of the deflectors, d1, can be varied. The other deflector is then controlled to provide the remaining deflection d2=D−d1. The deflections d1 and d2 can have the same sign or have opposite sign. In this manner, the dispersion can be varied by changing the value of d1 while the total deflection D remains constant. The total deflection D may be zero or have a finite value.

Further, the two deflectors of the dispersion compensation element 104 are selected to have respective dispersions which depend on their deflection in a different manner. For example, one of the deflectors may be an electric deflector and the other may be a magnetic deflector. In this case, the sum of their dispersions depends on the individual contributions d1 and d2 to the total deflection D, where the total deflection D remains constant. Similarly, the dispersion compensation element 104 can also include three or more deflectors.

Thus, the dispersion compensation element 104 allows for the adjustment of the second dispersion such that the second dispersion substantially compensates for the first dispersion, without the need to be concerned with a change in the beam inclination further downstream of the dispersion compensation element 104. In some embodiments, the second dispersion is also adjustable independently of the entire beam path of the primary beam 101 (e.g. also independently of its displacement) downstream of the dispersion compensation element 104.

Generally, the dispersion compensation element 104 is equipped with at least one deflector deflecting in two directions orthogonal to the beam propagation direction. Hence, the dispersion compensation element 104 is adapted for deflecting in these two directions. Even more preferably, the dispersion compensation element 104 is equipped with at least two deflectors deflecting in two directions orthogonal to the beam propagation direction. In this case, the dispersion compensation element 104 is adapted for deflecting and adjusting the beam dispersion in these two directions independently of the deflection.

Figure 4A:
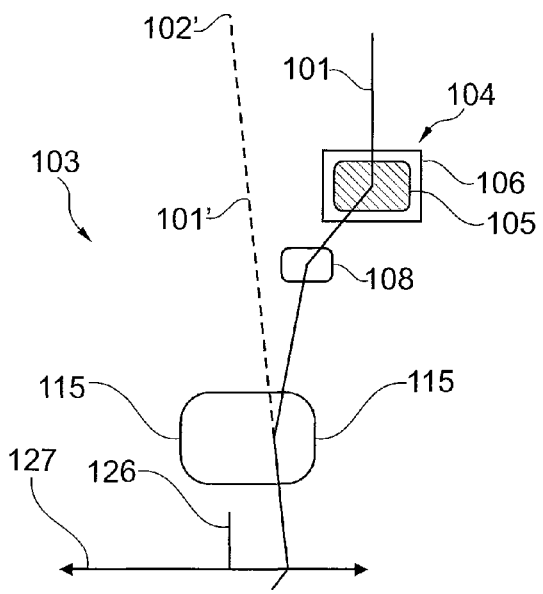

The beam tilting arrangement 103 of FIG. 4a corresponds to that of FIG. 2. In FIG. 4a, the beam tilting arrangement 103 includes a dispersion compensation element 104 and, downstream thereof, an additional deflector 108. The dispersion compensation element 104 includes a magnetic deflector 105 and an electrostatic deflector 106. The deflectors 105, 106 are controlled to give a non-zero total deflection D resulting in a deflection angle beta as shown in FIG. 2.

Figure 4B:
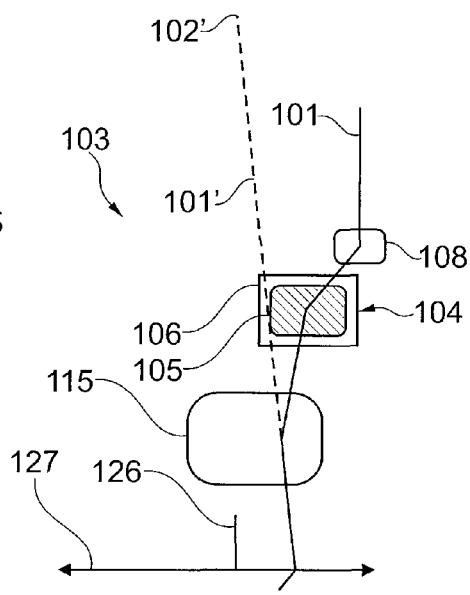

The beam tilting arrangement 103 of FIG. 4b is similar to that of FIG. 4a, except that the deflector 108 is arranged upstream of the beam tilting arrangement 103. Otherwise, the functionality of the respective elements is identical to that of FIGS. 2 and 4a.

Figure 4C:
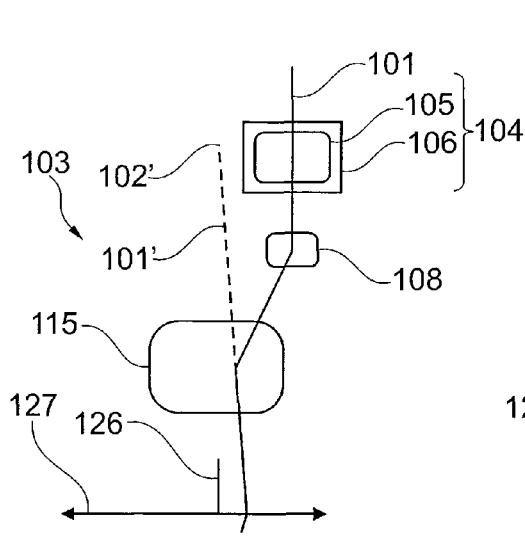

The beam tilting arrangement 103 of FIG. 4c is similar to that of FIGS. 1a, b (in the view of FIG. 1a). However, different from FIG. 1a, b, the deflectors 105, 106 are controlled to give zero total deflection D. Hence, the dispersion compensation element 104 is a Wien filter. The dispersion of the Wien filter can be adjusted by tuning the individual deflections d1 and d2 simultaneously so that D=d1+d2=0 at all times. The two-stage beam tilting is performed by the deflector 108 and by the beam separation deflector 115, in an analogous manner to the two-stage tilting performed, in FIG. 1, by the dispersion compensator 104 and the beam separation deflector 115. Having zero total deflection in the dispersion compensator 104 of FIG. 4c may reduce charge contamination of the column caused by deflected electrons striking the dispersion compensator 104. In FIG. 4c, like in FIG. 1a, b, the deflection of the signal electrons is dependent on the tilt.

Figure 4D:
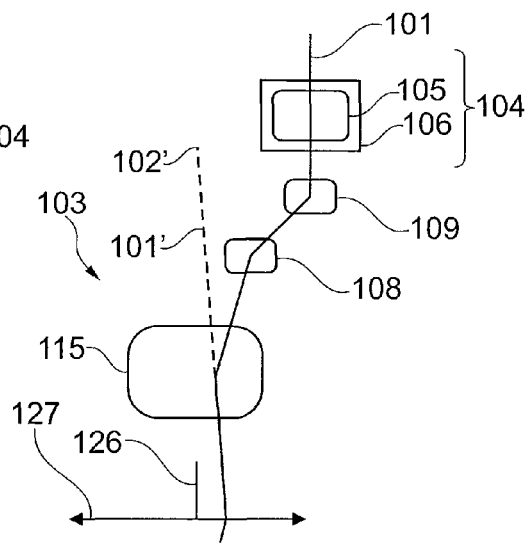

In the beam tilting arrangement 103 of FIG. 4d, an additional deflector 109 is provided in addition to the elements of FIG. 4c. Further, similar to FIG. 4c, the deflectors 105, 106 are controlled according to a Wien condition to give zero total deflection D. A two-stage deflection is obtained by two deflectors 109 and 108, in an analogous manner to the two-stage tilting performed, in FIG. 2, by the dispersion compensator 104 and the deflector 108. Thereby, the beam separation deflector 115 can be operated at constant tilt, similar to the apparatus of FIG. 2.

Figures 4E, 4F:
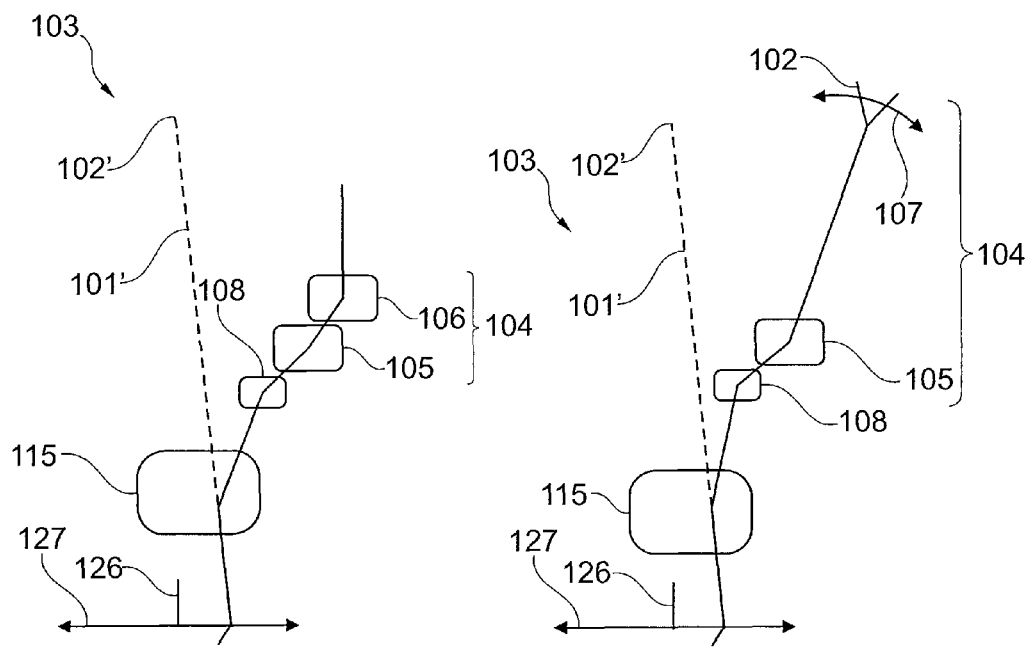

The apparatus of FIG. 4e is similar to that of FIG. 4a, except that the deflectors 105, 106 of the dispersion compensator 104 are provided at different positions along the beam path. Any permutation of the positions of the deflectors 105, 106 and 108 is possible. In the dispersion compensation element 104 of FIG. 4e, the magnetic deflector 105 and the electrostatic deflector 106 are spatially separated from one another along the path of the primary beam 101. The deflectors 105 and 106 are controlled so as to provide the appropriate total deflection D=d1+d2 that is equal in magnitude but opposite in direction to the deflection of the beam separation element 115 (similarly to FIG. 3a).

In FIG. 4e, the electrostatic deflector 106 is arranged upstream, along the path of the primary beam 101, of the magnetic deflector 105. In an alternative variant, the electrostatic deflector 106 may be arranged downstream of the magnetic deflector 105. Further, in FIG. 4e, the deflectors 105, 106 are controlled to provide deflections in the same direction. Alternatively, the deflectors 105, 106 may be controlled to provide deflections in opposite directions such that the deflection of deflectors 105, 106 partially or fully cancel each other.

Due to the spatial separation of the deflectors 105, 106, the beam is displaced, due to a similar effect as described with reference to FIG. 5. As a result, this displacement can be seen as an additional contribution to the second dispersion (dependence of the location of the beam 101 striking the specimen on beam energy) of the dispersion correction element 104. This additional contribution may be taken into account when the deflections d1 and d2 are adjusted such that the resulting total dispersion is zero. When the deflectors 105, 106 are displaced only by a small distance, the additional contribution to the second dispersion may also be neglected.

FIG. 4f is similar to FIG. 4a, except that the dispersion compensator 104 is realized in a different manner. Namely, in the dispersion compensation element 104 of FIG. 4f, the dispersion compensation element 104 contains a magnetic deflector 105 and a beam-source tilter 107. Alternatively, the magnetic deflector 105 can also be replaced by an electrostatic deflector or another type of deflector.

The beam-source tilter 107 has the effect of tilting the incoming electron beam 101 as seen by the magnetic deflector 105 or, in other words, of tilting the inclination angle of the virtual image of the beam source 102 as seen by the magnetic deflector 105.

The beam-source tilter 107 can, in principle, be implemented as a mechanical beam-source tilter for pivoting the beam source about a center, the center being preferably located at the center of the deflector 105. In the case of a mechanical beam-source tilter 107, the beam-source tilter has no dispersion, thus the total dispersion of the dispersion compensation element 104 equals the dispersion of the magnetic deflector 105.

Alternatively, the beam-source tilter 107 can be implemented by a deflector 106 as shown e.g. in FIG. 4e, or by a series of deflectors (electrostatic, magnetic, some other deflector, or combination thereof). In this case, the physical position of the beam source 102 may remain unchanged, and only the position of the virtual beam source is changed. The deflector of the beam-source tilter 107 is preferably of a different type than the deflector 105, otherwise the net dispersions of the beam-source tilter 107 and the deflector 105 would largely cancel such that the dispersion cannot be adjusted easily.

Further, the beam-source tilter 107 can include a combination of a mechanical beam-source tilter and of one or more deflector(s) (electric or magnetic or combination thereof). Then, the angle of the beam-source tilter 107 and the deflection due to the deflector 105 can be adjusted together such that the inclination angle of the primary beam 101 downstream of the deflector 105 is unchanged. Hereby, the second dispersion is adjusted. In particular, the second dispersion can be adjusted such that the second dispersion substantially compensates for the first dispersion. Also, by choosing the angle of the beam-source tilter 107 appropriately, the angle of the beam 101 leaving the dispersion compensator 104 can be chosen freely. In this manner, the dispersion compensator 104 can be used in analogy to FIG. 1, where the deflection by the dispersion compensator 104 corresponds to, in FIG. 4f, the angle of the primary beam 101 leaving the dispersion compensator 104.

Figures 4G, 4H:
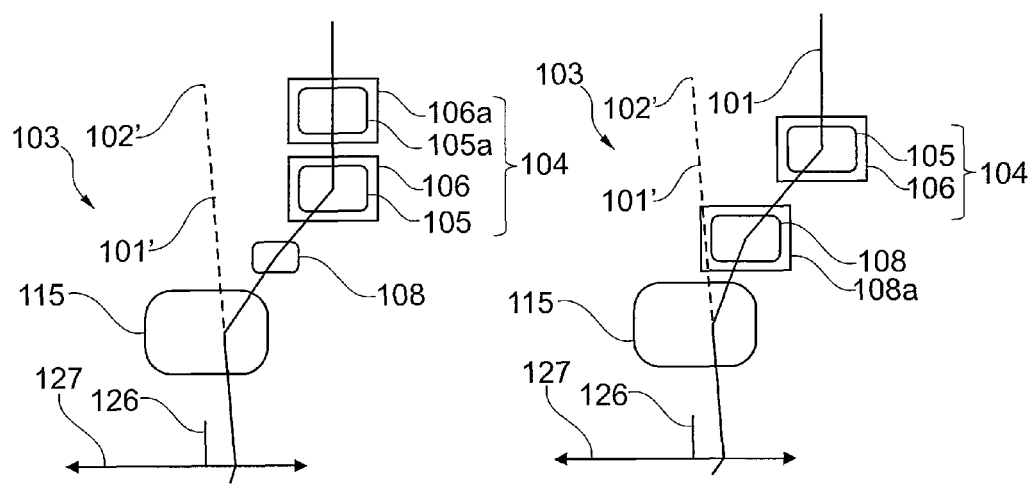

In FIG. 4g, an apparatus similar to that of FIGS. 2 and 4a is shown. In FIG. 4g, the dispersion compensator 104 has, in addition to the pair of deflectors 105, 106, a further pair of deflectors 105a, 106a. The pair 105a, 106a may be operated to generate a base dispersion independently of the tilt angle, e.g. the dispersion for compensating for a zero-tilt dispersion. Further, the pair 105, 106 may be operated to generate a remaining tilt-dependent component of the dispersion. In this manner, an accurate control of the relatively smaller tilt-dependent dispersion correction (with associated smaller tilt-dependent voltage) can be performed separately from the relatively larger base dispersion correction (with associated larger tilt-dependent voltage). Further, the deflector pair 105a, 106a is operated according to a Wien condition, and the deflector pair 105, 106 is operated so as to provide the full deflection of the dispersion compensation deflector 104.

The apparatus of FIG. 4h is similar to that of FIG. 4a, except that instead of the deflector 108 of FIG. 4a, a pair of deflectors 108, 108a is provided. The pair of deflectors is similar to the dispersion compensator 104, and therefore also has adjustable dispersion. In fact, the pair of deflectors 108, 108a can be regarded as part of the dispersion compensator. Namely, similar to the arrangement of FIG. 4g, in FIG. 4h the dispersion compensation can also be provided in part by the dispersion compensation due to the pair of deflectors 108, 108a, and in the remaining part by the dispersion compensation due to the pair of deflectors 105, 106.

FIG. 4i shows an apparatus similar to that of FIG. 4a, except that the beam source can be tilted by a beam-source tilter 107 as described with reference to FIG. 4f. In this manner, the beam source 102 can be tilted to such an angle that a base dispersion is compensated for when the beam is tilted by the magnetic deflector 105, without using e.g. the electrostatic deflector 106. This source-tilting corresponds essentially to the tilting described with reference to FIG. 4f. The additional electrostatic deflector 106 can then be used for fine-tuning the dispersion and/or adjusting the dispersion in dependence of the tilt. Together, the beam-source tilter 107 and the deflectors 105 and 106 thus have a function corresponding to the two pairs of deflectors in FIG. 4g.

FIG. 4j is similar to FIG. 4i, except that the beam-source tilter is absent and the beam 101 upstream of the beam separator 115 is inclined at a fixed angle with respect to the optical axis. Correspondingly, the beam source 102 and any other electron-optical elements upstream of the beam separator 135 are adapted to suit the inclined beam 101. The fixed angle is chosen such that a base dispersion is compensated for when the beam is tilted by the magnetic deflector 105, without using e.g. the electrostatic deflector 106, e.g. the dispersion for zero tilt. Then, the dispersion compensator 104 can be driven only with a low dispersion voltage.

The beam apparatus may be adapted for a particular rated beam energy. In this case, the inclination angle of the beam source 102 (or of the beam 101 directly upstream the dispersion compensation element 104) can be chosen such that in the absence of an electric field of the electrostatic deflector 106 and at the rated beam energy, the total first-order aberration of the beam 101 is zero. This inclination may be found by a numerical simulation of the beam path of beam 101. Alternatively, the inclination may be found by tuning an apparatus with adjustable inclination (such as the apparatus of FIG. 4j), until the chromatic aberration vanishes. Such an inclination angle may then be used not only in the embodiment of FIG. 4j, but also in any other embodiment.

With this inclination, the dispersion of the dispersion compensation element 104 can be adjusted as in FIG. 3a, by simultaneous adjustment of the deflectors 105 and 106 whilst the total deflection D=d1+d2 remains constant. Here, for energies near the rated energy, only a small electrical field is needed. Therefore, the electrodes can be arranged relatively far away from the beam 101, where they are less prone to contamination.

As a general aspect, the apparatus may be equipped with a tilted beam source, emitting electrons at a tilted angle with respect to the optical axis. In particular, the angle may be tilted such that the aberration is reduced in comparison with an upright column beam source emitting electrons parallel to the optical axis, in other words, for at least partially compensating for a dispersion of the electron beam.

In this manner, other embodiments can also be equipped with such a tilted beam source. For example, FIG. 4k shows a variation of the embodiment of FIG. 1a, which is equipped with a tilted beam source similar to that of FIG. 4j as described above. In a similar manner, e.g. the embodiment of FIG. 4d can be modified to include a tilted beam source.

FIG. 4l shows an arrangement of the dispersion compensation element 104 and the beam separator 115 which is similar to that of FIG. 1a, but in which the dispersion compensation element 104 is tilted with respect to the optical axis. More precisely, the dispersion compensation element 104 is tilted such that its axis 104a has a non-zero angle with respect to the incoming beam 101. This angle is smaller than a deflection angle, i.e. the angle between the incoming beam and an outgoing beam from the dispersion compensation element 104, at a given deflection, e.g. zero deflection or some commonly used deflection. In particular, this angle may be half of the deflection angle. The axis 104a may be defined, for example, as being perpendicular to a main magnetic field as well as to a main electric field of the dispersion compensation element.

The embodiments may be varied in a further manner. For example, the beam source inclination in any of the embodiments described herein may be adjustable by a beam-source tilter or may be non-adjustable. The beam upstream the dispersion compensation element may be parallel or non-parallel to the optical axis.

Generally, the objective lens body 125 can be designed, and the beam separation element 115 can be arranged inside it as described in the co-pending EP patent application No. 10 162 334.6 filed May 7, 2010, which is herewith incorporated in this application in its entirety. Especially, the objective lens body 125 can be designed, and the beam separation element 115 can be arranged inside it as described in FIG. 4 the description thereof in the referenced patent application.

Generally, the objective lens is a beam-focusing lens for focusing the primary beam 101 onto the specimen 130, more specifically a final focusing lens. The objective lens 127 may also be adapted for demagnifying the crossover of the electron beam 101.

The objective lens 127 may be a compound electric-magnetic lens, but it may also be a different type of lens such as an electrostatic or magnetic lens. In any case, the lens may have one or more focusing electrode(s) for focusing the primary beam. The focusing electrode may at the same time serve to decelerate the beam to a predetermined energy. The focusing electrode may further be supplemented by an adjustment electrode and/or another adjustment arrangement for adjusting and fine-tuning the focus. A further electrode may be controlled to have specimen potential. The beam separator may in any case be enclosed by the lens body 125, or be positioned directly upstream of the objective lens, i.e. with no other beam-optical element in between. Also, a beam scanner may be provided between the beam separator and the objective lens downstream of the beam separator. In particular, the beam scanner may be provided as the only element between the beam separator and the objective lens. The beam scanner may be a magnetic or electrostatic scanner. Also, the scanner may, simultaneously, have additional functionality such as in the case of an electrostatic scanner whose electrostatic octopole element also provides a stigmator field. Also, the beam separator is generally arranged such that its magnetic deflection field does not substantially overlap with the electrostatic focusing field of the objective lens.

The objective lens 127 may be a double-focusing sector unit including a sector (a quadrupole unit, and a cylinder lens or side plates) for focusing in a first dimension and a sector for focusing in a second direction. The objective lens 127 may alternatively also be an Einzel lens or any other type of lens.

According to a general aspect, the beam separator 115 is located in the bore of the objective lens 127, but outside of a region of substantial focusing electrical field of the objective lens 127. Thereby, a substantial superposition of magnetic deflection field of the beam separator 115 and of electric focusing field of the lens 127 are avoided.

Further, a scanning unit (not shown) may be provided. The scanning unit may be positioned either within the lens 127 (e.g. downstream of the beam separator 115) or further downstream of the lens 127, i.e. positioned between the lens and the specimen.

The above embodiments can be varied in a number of further ways. For example, the structure for guiding the signal electron beam to the beam detector can be arbitrarily varied. Generally, the structure includes focusing and filtering optics for the signal electron beam which have no effect on the primary electron beam.

Further, the electron beam device can include a plurality of columns, each column including a respective beam source and the other elements as described herein, such as some or all elements shown in FIGS. 1a, 1b and 2. Also, the electron beam apparatus can include further electron-optical elements such as a scanning arrangement downstream of the electron objective lens.

In the following, some further general aspects of the invention are described. Any of these aspects may be combined with any other aspect or embodiment described herein.

According to an aspect, the beam separator is a beam separation deflector, and the beam tilting deflector arrangement comprises a first beam tilt deflector arranged upstream of the beam separation deflector, wherein the beam tilting deflector arrangement is configured to tilt the primary electron beam such that the primary electron beam is directed, by the combined action of the beam tilting arrangement and the beam separation deflector, to the electron lens at the adjustable offset. The beam separation deflector may be adapted for deflecting the primary beam by a deflection strength independent of the tilting. According to a further aspect, the beam pre-tilting deflector arrangement comprises a second beam tilt deflector arranged upstream of the beam separation deflector. According to a further aspect, the beam separation deflector is adapted for deflecting the primary electron beam at a predefined beam separation deflection angle independent of the adjustable offset. Thus, the beam pre-tilting arrangement may be configured for achieving different offsets with the beam separation deflector deflecting the primary electron beam at the predefined beam separation deflection angle irrespective of the offset. According to a further aspect, the oblique beam landing angle is adjustable in two directions orthogonal to the optical axis. According to a further aspect, the beam separation deflector defines a separation deflection direction, and the beam pre-tilting arrangement is adapted for tilting the beam in a first tilting direction parallel to the separation deflection direction, and for tilting the beam in a second tilting direction orthogonal to the separation deflection direction. According to a further aspect, the beam tilting arrangement is configured to tilt the primary electron beam such that the primary electron beam is directed to the electron lens, seemingly emerging from a virtual source independent of the adjusted offset and/or from a virtual source located on the optical axis. According to a further aspect, the beam emitter is laterally displaced from the optical axis (and/or from the virtual source). According to a further aspect, the beam tilting arrangement can be disabled to deflect the primary beam such that the primary beam downstream of the beam tilting arrangement is essentially on the optical axis. According to a further aspect, a three-stage tilting arrangement is provided having at least three deflectors, with the third stage being the beam separation deflector with fixed deflection.

According to a further aspect, the dispersion compensation element is adapted for independently adjusting the compensation dispersion in two directions, e.g. directions of anisotropy axes. According to a further aspect, the compensation dispersion is independently adjustable in an x-direction and in a y-direction, the x- and y-directions being orthogonal to each other. According to a further aspect, the dispersion compensation element has two pairs of electrode plates, one in the x-direction and one in the y-direction. According to a further aspect, the dispersion compensation element includes a magnetic deflector and an electrostatic deflector. The electrostatic and magnetic fields of the electrostatic and the magnetic deflectors can be overlapping (as in a Wien Filter type element) or spatially separated from one another. According to a further aspect, the dispersion compensation element includes a first compensation sub-element for adjusting a first compensation dispersion of the primary electron beam so as to compensate for an aberration resulting from the chromatic aberration, and a second compensation sub-element for adjusting a second compensation dispersion of the primary electron beam so as to compensate for an aberration resulting from the first dispersion. According to a further aspect, the dispersion compensation element is adapted for adjusting the second dispersion relationship independently of the path of the primary beam. According to a further aspect, the dispersion compensation element and the beam separator are adapted to deflect the electron beam within the same plane. According to a further aspect, the dispersion compensation element is arranged upstream of the beam separation deflector and/or the objective lens. According to a further aspect, the dispersion compensation element comprises a first deflector and a second deflector, wherein the first deflector and the second deflector have mutually different dispersion characteristics. According to a further aspect, the first deflector is a magnetic deflector, and the second deflector is an electrostatic deflector. According to a further aspect, the first and second deflectors are controlled according to a Wien condition to have substantially opposite deflection angles for a main energy beam component. According to a further aspect, the apparatus has a controller adapted to control the first and second deflectors so as to have deflection angles that, when superimposed, result in a pre-determined deflection angle, wherein the pre-determined deflection angle is equal in magnitude but opposite in direction to the deflection angle of the beam separator. According to a further aspect, the dispersion compensation element is arranged outside of a secondary electron path of the electron beam device. The aberration compensated for by the dispersion compensation element is not limited to the aberration from the first dispersion and from the chromatic aberration. The aberration may include further effects such as a dispersion caused by the beam pre-tilting arrangement or any other portion of the beam column.

According to a further aspect, the beam separator is a deflector, such as a magnetic deflector, and in particular a purely magnetic deflector. According to a further aspect, the beam separator is arranged upstream of objective lens, e.g. in the beam direction between the tilting arrangement and the objective lens. According to a further aspect, the inclination angle of the primary electron beam directly upstream of the beam separator is less than 10°. According to a further aspect, at least one of the beam separation element and the dispersion compensation element is provided at a position which provides a cross-over-free beam path of the primary beam. According to a further aspect, the beam separator is enclosed by the body of the objective lens. According to a further aspect, the beam separation deflector is adapted to deflect the primary beam by a deflection angle independently of the tilting angle, or by being controlled to have a deflection strength which is independent of the tilting angle. According to a further aspect, the beam separation deflector is adapted to contribute to the beam tilting by the beam tilting arrangement, by deflecting the beam by a deflection angle which is dependent on the tilting angle, or by being controlled to have a deflection strength which is dependent on the tilting angle.

According to a further aspect, the electron beam device further comprises an aspherically-acting element for compensating for a spherical aberration and/or for compensating for a lens astigmatism. According to a further aspect, the aspherically-acting element includes an octopole element. According to a further aspect, the octopole element is arranged downstream of beam separation deflector. According to a further aspect, the octopole element is at least partially integrated with the lens. According to a further aspect, the octopole element is also adapted as a beam scanner.

According to a further aspect, the apparatus further comprises a specimen receiver for receiving a specimen, the specimen receiver defining a specimen plane at which the specimen interacts with the electron beam during operation of the electron beam device, wherein the distance to the beam separator from the specimen plane is less than ¼ of the primary beam length. According to a further aspect, the electron beam device further comprises a dispersion compensation controller adapted to adjust the compensation dispersion such as to compensate for a beam aberration resulting from the first dispersion and from the chromatic aberration.

While the foregoing is directed to embodiments of the invention, further embodiments of the invention may be devised without departing from the basic scope thereof, and the scope thereof is determined by the claims that follow.

The invention claimed is:

1. An electron beam device, comprising:
 a beam emitter for emitting a primary electron beam;
 an objective electron lens for focusing the primary electron beam onto a specimen, wherein the objective lens defines an optical axis;
 a beam tilting arrangement configured for directing the primary electron beam to the electron lens at an adjustable offset from the optical axis such that the objective electron lens directs the electron beam to strike the specimen at an adjustable oblique beam landing angle, whereby a chromatic aberration is caused;
 a beam separator having a transverse deflection field orthogonal to the optical axis and a first dispersion for separating a signal electron beam from the primary electron beam; and
 a dispersion compensation element adapted for adjusting a compensation dispersion of the primary electron beam such as to compensate a beam aberration resulting from the first dispersion and from the chromatic aberration, wherein the beam separator is a purely magnetic deflector which includes a magnetic element as the only deflecting element.

2. The electron beam device according to claim 1, wherein the beam separator is a beam separation deflector, and wherein the beam tilting deflector arrangement comprises a first beam tilt deflector arranged upstream of the beam separation deflector, wherein the beam tilting deflector arrangement is configured to tilt the primary electron beam such that the primary electron beam is directed, by the combined action of the beam tilting arrangement and the beam separation deflector, to the electron lens at the adjustable offset.

3. The electron beam device according to claim 2, wherein the beam separation deflector is adapted for deflecting the primary beam by a deflection strength independent of the tilting.

4. The electron beam device according to claim 2, wherein the beam pre-tilting deflector arrangement comprises a second beam tilt deflector arranged upstream of the beam separation deflector.

5. The electron beam device according to claim 1, wherein the beam separation deflector is adapted for deflecting the primary electron beam at a predefined beam separation deflection angle independent of the adjustable offset.

6. The electron beam device according to claim 1, wherein the oblique beam landing angle is adjustable in two directions orthogonal to the optical axis.

7. The electron beam device according to claim 1, wherein the beam tilting arrangement is configured to tilt the primary electron beam such that the primary electron beam is directed to the electron lens, seemingly emerging from a virtual source independent of the adjusted offset.

8. The electron beam device according to claim 1, wherein the beam emitter is laterally displaced from the optical axis.

9. The electron beam device according to claim 1, wherein the dispersion compensation element is adapted to independently adjust the compensation dispersion in two directions.

10. The electron beam device according to claim 1, wherein the dispersion compensation element includes a magnetic deflector and an electrostatic deflector.

11. The electron beam device according to claim 1, wherein the dispersion compensation element includes a first compensation sub-element for adjusting a first compensation dispersion of the primary electron beam so as to compensate for an aberration resulting from the chromatic aberration, and a second compensation sub-element for adjusting a second compensation dispersion of the primary electron beam so as to compensate for an aberration resulting from the first dispersion.

12. The electron beam device according to claim 1, wherein the dispersion compensation element is adapted for adjusting the second dispersion relation independently of a path of the primary beam.

13. The electron beam device according to claim 1, wherein the dispersion compensation element comprises a first deflector and a second deflector, wherein the first deflector and the second deflector have mutually different dispersion characteristics, in particular wherein the first deflector is a magnetic deflector, and the second deflector is an electrostatic deflector.

14. The electron beam device according to claim 1, wherein the beam separator is immersed in a body of the objective lens.

15. The electron beam device according to claim 1, further comprising an aspherically-acting element for at least one of compensating for a spherical aberration and compensating for a lens astigmatism.

16. The electron beam device according to claim 15, wherein the aspherically-acting element includes an octopole element.

17. The electron beam device according to claim 16, wherein the octopole element is arranged, in primary beam direction, downstream of beam separation deflector and is at least partially integrated with a body of the lens.

18. The electron beam device according to claim 1, further comprising a dispersion compensation controller adapted to adjust the compensation dispersion so as to compensate for a beam aberration resulting from the first dispersion and from the chromatic aberration.

19. The electron beam device according to claim 1, wherein the beam separator is located upstream of the objective lens.

20. The electron beam device according to claim 1, wherein the beam separator is arranged such that its magnetic deflection field does not substantially overlap with an electrostatic focusing field of the objective lens.

21. A method of operating an electron beam device, the method comprising:
    emitting a primary electron beam by a beam emitter;
    adjusting a compensation dispersion of the primary electron beam by a compensation element;
    directing, by a beam tilting arrangement, the primary electron beam to an electron lens at an adjusted offset from an optical axis defined by the electron lens;
    allowing the primary electron beam to pass through a beam separator having a transverse deflection field orthogonal to the optical axis and a first dispersion, the beam separator being a purely magnetic deflector, the beam separator deflecting the primary electron beam by a magnetic element as the only deflecting element;
    focusing the offset primary electron beam onto a specimen by the objective electron lens, thereby causing a chromatic aberration of the primary electron beam and directing the primary electron beam to strike the specimen at an adjusted oblique beam landing angle;
    generating a signal electron beam by an interaction of the primary electron beam with the specimen; and
    separating the signal electron beam from the primary electron beam by the beam separator, whereby
    the dispersion compensation element adjusts the compensation dispersion in such a way as to compensate for a beam aberration resulting from the first dispersion and from the chromatic aberration.

* * * * *